United States Patent
Liu et al.

(10) Patent No.: US 8,962,430 B2
(45) Date of Patent: Feb. 24, 2015

(54) METHOD FOR THE FORMATION OF A PROTECTIVE DUAL LINER FOR A SHALLOW TRENCH ISOLATION STRUCTURE

(71) Applicants: STMicroelectronics, Inc., Coppell, TX (US); International Business Machines Corporation, Armonk, NY (US)

(72) Inventors: Qing Liu, Guilderland, NY (US); Nicolas Loubet, Guilderland, NY (US); Bruce Doris, Slingerlands, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/907,237

(22) Filed: May 31, 2013

(65) Prior Publication Data
US 2014/0357039 A1 Dec. 4, 2014

(51) Int. Cl.
*H01L 21/336* (2006.01)
*H01L 21/762* (2006.01)
*H01L 29/06* (2006.01)
*H01L 29/66* (2006.01)

(52) U.S. Cl.
CPC ...... *H01L 21/76224* (2013.01); *H01L 29/0649* (2013.01); *H01L 29/66477* (2013.01)
USPC ........... 438/296; 438/294; 438/424; 438/435; 438/437; 257/E21.409

(58) Field of Classification Search
None
See application file for complete search history.

(56) References Cited

U.S. PATENT DOCUMENTS

| | | |
|---|---|---|
| 5,702,976 A | 12/1997 | Schuegraf et al. |
| 6,133,105 A | 10/2000 | Chen et al. |
| 6,265,282 B1 | 7/2001 | Lane et al. |
| 6,710,413 B2 | 3/2004 | Thei et al. |
| 7,015,116 B1 | 3/2006 | Lo et al. |
| 7,112,495 B2 | 9/2006 | Ko et al. |
| 7,166,531 B1 | 1/2007 | van den Hoek et al. |
| 7,190,036 B2 | 3/2007 | Ko et al. |
| 7,221,024 B1 | 5/2007 | Chidambarrao et al. |
| 7,309,640 B2 | 12/2007 | Martin et al. |
| 7,365,357 B2 | 4/2008 | Atanackovic et al. |

(Continued)

OTHER PUBLICATIONS

Yang, Ruipeng, et al.: "Advanced in Situ Pre-Ni Silicide (Siconi) Cleaning at 65 nm to Resolve Defects in NiSi[sub X] Modules," Journal of Vacuum Science & Technology B; Microelectronics and Namometer Structures 28.1 (2010).

(Continued)

*Primary Examiner* — Angel Roman
(74) *Attorney, Agent, or Firm* — Gardere Wynne Sewell LLP

(57) ABSTRACT

On a substrate formed of a first semiconductor layer, an insulating layer and a second semiconductor layer, a silicon oxide pad layer and a silicon nitride pad layer are deposited and patterned to define a mask. The mask is used to open a trench through the first semiconductor layer and insulating layer and into the second semiconductor layer. A dual liner of silicon dioxide and silicon nitride is conformally deposited within the trench. The trench is filled with silicon dioxide. A hydrofluoric acid etch removes the silicon nitride pad layer along with a portion of the conformal silicon nitride liner. A hot phosphoric acid etch removes the silicon oxide pad layer, a portion of the silicon oxide filling the trench and a portion of the conformal silicon nitride liner. The dual liner protects against substrate etch through at an edge of the trench between the first and second semiconductor layers.

10 Claims, 6 Drawing Sheets

(56) References Cited

U.S. PATENT DOCUMENTS

| | | |
|---|---|---|
| 7,423,330 B2 | 9/2008 | Satoh |
| 7,442,620 B2 | 10/2008 | Wu et al. |
| 7,767,515 B2 | 8/2010 | Moroz et al. |
| 7,816,766 B2 | 10/2010 | Tamura et al. |
| 7,821,074 B2 | 10/2010 | Yokoyama |
| 7,939,413 B2 | 5/2011 | Chong et al. |
| 7,989,912 B2 | 8/2011 | Yi |
| 8,026,571 B2 | 9/2011 | Lu et al. |
| 8,187,975 B1 | 5/2012 | Khare et al. |
| 8,216,904 B2 | 7/2012 | Dove |
| 8,368,143 B2 * | 2/2013 | Bedell et al. ............ 257/347 |
| 8,609,508 B2 | 12/2013 | Dove |
| 8,703,550 B2 * | 4/2014 | Doris et al. ............ 438/151 |
| 2002/0081809 A1 * | 6/2002 | Pinto et al. ............ 438/296 |
| 2005/0156274 A1 | 7/2005 | Yeo et al. |
| 2005/0158937 A1 | 7/2005 | Yang et al. |
| 2005/0167778 A1 | 8/2005 | Kim et al. |
| 2005/0245043 A1 | 11/2005 | Martin et al. |
| 2005/0263825 A1 | 12/2005 | Frohberg et al. |
| 2005/0275060 A1 | 12/2005 | Dokumaci et al. |
| 2006/0183296 A1 * | 8/2006 | Yoo et al. ............ 438/424 |
| 2006/0214258 A1 | 9/2006 | Kiyotoshi |
| 2007/0290293 A1 | 12/2007 | Trivedi et al. |
| 2008/0122000 A1 | 5/2008 | Lindsay |
| 2008/0194070 A1 | 8/2008 | Shih et al. |
| 2008/0293194 A1 | 11/2008 | Chen et al. |
| 2008/0303102 A1 | 12/2008 | Liang et al. |
| 2009/0140375 A1 | 6/2009 | Kim |
| 2009/0289279 A1 | 11/2009 | Khare |
| 2010/0109091 A1 | 5/2010 | Griebenow et al. |
| 2010/0258869 A1 * | 10/2010 | Morita et al. ............ 257/347 |
| 2011/0024840 A1 | 2/2011 | Khater |
| 2011/0117714 A1 * | 5/2011 | Levy et al. ............ 438/296 |
| 2012/0119296 A1 | 5/2012 | Anderson et al. |
| 2012/0313168 A1 | 12/2012 | Cheng et al. |
| 2013/0334603 A1 * | 12/2013 | Cheng et al. ............ 257/347 |
| 2014/0054698 A1 * | 2/2014 | Liu et al. ............ 257/347 |

OTHER PUBLICATIONS

Ito, Shinya: "Effect of Mechanical Stress Inducted by Edtch-stop Nitride: Impact on Deep-sibmicron Transistor Performance," Microelectronics Reliability 42 (2002); 201-209.

Zaouia, S.: "Investigation of Compressive Strain Effects Induced by STI and ESL," Nanoscaled Semiconductor on Insultation Structures and Devices (2007), 239-250.

\* cited by examiner

METHOD FOR THE FORMATION OF A PROTECTIVE DUAL LINER FOR A SHALLOW TRENCH ISOLATION STRUCTURE

TECHNICAL FIELD

The present invention relates to integrated circuits and, in particular, to a process for the formation of shallow trench isolation (STI) structures for transistors formed on substrates with thin buried oxide layers.

BACKGROUND

Increased circuit density is a critical goal of integrated circuit design and fabrication. In order to achieve higher density, a downscaling of the transistors included within the circuit is effectuated. Such downscaling is typically achieved by shrinking the overall dimensions (and operating voltages) of the transistors. This shrinking cannot, however, be achieved at the expense of electrical performance. This is where the challenge arises: how to reduce transistor dimensions while maintaining the electrical properties of the device.

Conventional planar FET devices formed on bulk semiconductor substrates are quickly reaching their downscaling limit. Integrated circuit designers are accordingly turning towards new process technologies, new supporting substrates and new transistor configurations to support smaller and smaller transistor sizes without sacrificing transistor performance. One such new supporting substrate technology concerns the use of silicon on insulator (SOI) substrates to support the fabrication of transistor devices of smaller size. An SOI substrate is formed of a top semiconductor (for example, silicon) layer over an insulating (for example, silicon dioxide) layer over a bottom semiconductor (for example, silicon) substrate layer. Further substrate development has reduced the thickness of the intervening insulating layer to about 50 nm to produce a substrate for use in transistor fabrication that is referred to as an extremely thin silicon on insulator (ET-SOI) substrate. Still further substrate development has reduced the thicknesses of all substrate layers to produce a substrate for use in transistor fabrication that is referred to an ultra-thin body and buried oxide (UTBB) substrate where the thickness of the intervening insulating layer is about 25 nm (or less) and the thickness of the top semiconductor layer is about 5 nm to 10 nm.

In a transistor fabricated using a UTBB substrate, the channel region of the transistor is formed in the ultra-thin top semiconductor layer which is fully depleted and is beneficial for controlling short channel effects. The thinner intervening insulating layer supports an aggressive transistor scaling capability, and permits tuning of the transistor threshold voltage (Vt) through the application of a back bias to the bottom semiconductor substrate layer.

To isolate adjacent transistors from each other, it is known in the art to use shallow trench isolation (STI) techniques. With transistors formed on a UTBB substrate, the STI structure is preferably a high aspect ratio structure (for example, having a ratio of about 1:10) which extends through both the ultra-thin top semiconductor layer and the thinner intervening insulating layer to reach into the bottom semiconductor substrate layer. In a preferred implementation, the bottom of the STI structure is about 150 nm below the intervening insulating layer.

When forming an STI structure, a trench is formed adjacent the transistor active region extending through the ultra-thin top semiconductor layer and the thinner intervening insulating layer and into the bottom semiconductor substrate layer. The trench is then filled with an insulating material such as silicon dioxide to a level above the top surface of the ultra-thin top semiconductor layer. The deposited silicon dioxide is then recessed by an etching process (typically using hydrofluoric acid (HF)). The recessing process, however, creates a problem at the edge of the STI structure due to the formation of a divot having a depth that could extend through both the ultra-thin top semiconductor layer and the thinner intervening insulating layer of the UTBB substrate. If a conductive or semi-conductive material used in subsequent transistor fabrication process steps fills this divot, an undesirable short circuit is created between the transistor source/drain region and the bottom semiconductor substrate layer.

The prior art recognizes this divot and short problem and teaches a solution whereby the trench formed adjacent the transistor active region is first lined with a protective liner material before the trench is filled with the insulating material. The protective liner material is specifically chosen to be resistant to the HF etch solution used to recess the deposited silicon dioxide which fills the trench. For example, the prior art teaches the use of high temperature iRAD silicon nitride (SiN) material for the protective trench liner.

This protective liner solution has not completely addressed the problem of divot and short formation. The reason for this is that silicon nitride (SiN) films are commonly used in integrated circuit fabrication processing. These SiN films are often patterned and etched and must at some point in the fabrication process be selectively removed. For example, a hot phosphoric acid treatment is often used to effectuate selective removal of the SiN material. Because the protective liner is also made of SiN, the recessing of a SiN layer in a subsequent transistor fabrication process step will also attack the SiN liner to form a divot at the edge of the STI structure. Depending on the etch budget, the divot may have a depth extending through both the ultra-thin top semiconductor layer and the thinner intervening insulating layer of the UTBB substrate. Subsequently deposited conductive or semiconductive material filling this divot can create a short circuit between the transistor source/drain region and the bottom semiconductor substrate layer.

In an alternate solution, the prior art teaches the use of a high k dielectric material for the trench liner. For example, $HfO_2$ or $HfSiO_x$ materials are proposed for used as a trench liner. There is a concern, however, with introducing either of these materials into the semiconductor fabrication environment for fear of contamination. Thus, rather than introduce a new material to the process, those skilled in the art would prefer the use of more commonly used semiconductor fabrication materials which are also used in the formation of other semiconductor integrated circuit structures.

There is accordingly a need in the art to address the divot problem which may lead to short circuit defects at shallow trench isolation (STI) structures formed in a UTBB substrate. More specifically, a need exists to improve the process margin for STI fabrication to resist both the hydrofluoric acid etch used to recess silicon dioxide structures and the hot phosphoric acid etch used to recess silicon nitride structures.

SUMMARY

In an embodiment, a method comprises: on a substrate formed of a first semiconductor layer over an insulating layer over a second semiconductor layer, depositing a first pad layer formed of a first pad material; depositing a second pad layer formed of a second pad material; patterning the first and second pad layers to define a mask; using said mask to open a trench surrounding an active region, said trench extending through both the first semiconductor layer and the insulating layer and further extending at least partially into the second semiconductor layer; depositing a first conformal liner made of a first liner material in said trench; depositing a second conformal liner made of a second liner material on said first conformal liner in said trench; and filling said trench with an insulating material.

In an embodiment, an apparatus comprises: a substrate formed of a first semiconductor layer over an insulating layer over a second semiconductor layer; a trench formed in said substrate to surround an active region, said trench extending through both the first semiconductor layer and the insulating layer and further extending at least partially into the second semiconductor layer; a first conformal liner made of a first liner material in said trench; a second conformal liner made of a second liner material on said first conformal liner in said trench; and an insulating material filling said trench.

In an embodiment, a method comprises: on a substrate formed of a first semiconductor layer over an insulating layer over a second semiconductor layer, depositing a silicon oxide pad layer; depositing a silicon nitride pad layer on said silicon oxide pad layer; patterning the silicon nitride and silicon oxide pad layers to define a mask; applying a directional etch through said mask to open a trench surrounding an active region, said trench extending through both the first semiconductor layer and the insulating layer and further extending at least partially into the second semiconductor layer; depositing a conformal silicon dioxide liner in said trench; depositing a conformal silicon nitride liner on said conformal silicon dioxide liner in said trench; filling said trench with a silicon dioxide material; applying a hydrofluoric acid etch to remove the silicon nitride pad layer along with a top portion of the conformal silicon nitride liner; and applying a hot phosphoric acid etch to remove the silicon oxide pad layer, a portion of the silicon oxide material filling said trench and a top portion of the conformal silicon nitride liner.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
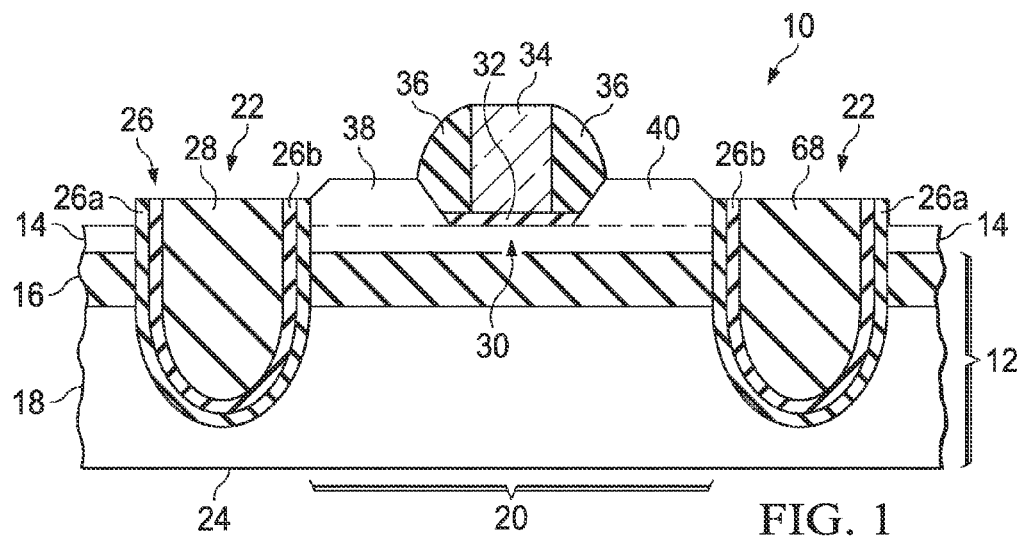
FIG. 1 is a cross-section of a field effect transistor (FET) in accordance with a preferred implementation.

FIG. 1 illustrates a cross-section of a field effect transistor (FET) 10. The transistor 10 is fabricated on an ultra-thin body and buried oxide (UTBB) substrate 12 having a top semiconductor (for example, silicon) layer 14 over an insulating (for example, silicon dioxide) layer (BOX) 16 over a bottom semiconductor (for example, silicon) substrate layer 18. The top semiconductor layer 14 may have a thickness of 5 nm to 10 nm. The insulating layer 16 may have a thickness of 10 nm to 30 nm. The bottom semiconductor substrate layer 18 may have a thickness of 100 microns to 800 microns. The top semiconductor layer 14 and bottom semiconductor substrate layer 18 may be doped as appropriate for the integrated circuit application.

Although a UTBB substrate 12 is preferred, it will be understood that the substrate 12 may alternatively comprise a silicon on insulator (SOI) substrate or extremely thin silicon on insulator (ETSOI) substrate.

An active region 20 of the substrate 12 where the transistor 10 is formed is surrounded by a shallow trench isolation (STI) structure 22. The STI structure 22 extends fully through the top semiconductor layer 14 and insulating layer 16 of the substrate 12. The STI structure 22 further penetrates into at least a portion of bottom semiconductor substrate layer 18. Although not specifically illustrated in FIG. 1, in an embodiment the STI structure 22 extends fully through the bottom semiconductor substrate layer 18 to reach a bottom surface 24 of the substrate 12. The STI structure 22 is formed of a dual liner 26 including an outer liner 26a and an inner liner 26b. In a preferred embodiment, the outer liner 26a is formed of a silicon dioxide ($SiO_2$) material, and the inner liner 26b is formed of a silicon nitride (SiN) material. It will be understood, however, that the dual liner 26 may use other materials such as $Al_2O_3$ for the outer liner 26a and $HfO_2$ or HfSiO for the inner liner 26b. The STI structure 22 is filled with an insulating material 28 such as silicon dioxide ($SiO_2$). It will be understood, however, that the STI structure 22 fill material may alternatively comprise SiN or $Al_2O_3$.

Within the active region 20, the top semiconductor layer 14 is used to form the channel region 30 of the transistor 10. The channel region 30 is doped as appropriate for the conductivity type of the transistor 10. Above the channel region 30 is formed the gate insulator 32. Although illustrated as having a single layer, it will be understood that the gate insulator 32 may be formed of multiple layers including a gate dielectric layer. For example, the gate insulator 32 may be formed of the following materials: SiO2, SiON, $HfO_2$ and HfSiO. The gate electrode 34 is formed over the gate insulator 32. The gate electrode 34 may comprise a polysilicon material and may be partially or fully silicided as desired for the circuit implementation. On either side of the gate electrode 34 are formed spacers 36. Although illustrated as a single structure, it will be understood that the spacers 36 may be formed of multiple layers. For example, the spacers 36 may be formed of the following materials: SiN and $SiO_2$. The transistor 10 further includes a source region 38 and drain region 40 formed from the top semiconductor layer 14. In a preferred implementation, the source region 38 and drain region 40 are of the raised source/drain type epitaxially grown from the top semiconductor layer 14 (indicated by the dotted line). The raised source/drain structure may comprise silicon (Si), silicon-germanium (SiGe) and/or silicon-carbide (SiC) doped as appropriate for the conductivity type of the transistor 10. The source/drain regions may be partially or fully silicided as desired for the circuit implementation.

The dual liner 26 advantageously functions to protect against the formation of a short circuit connection between the source or drain region and the bottom semiconductor substrate layer 18 (passing through the insulating layer 16 of the substrate 12). The structure of the dual liner 26 is resistant to the hydrofluoric acid etch (used to recess silicon dioxide) and the hot phosphoric acid etch (used to recess silicon nitride). As discussed above in connection with the prior art, these etches can open a divot at the edge of the STI structure that passes through the insulating layer 16 and can become filled with conductive or semiconductive materials (from silicide formation at the source/drain, epitaxial growth when forming the raised source/drain, or local interconnect metal made to the source/drain) to produce a short.

The inner liner 26b formed of the silicon nitride (SiN) material is used to seal the STI structure 22 against hydrofluoric acid attack and prevent the creation of a divot prior to the formation of the transistor gate structures (i.e., the gate stack). The outer liner 26a formed of the silicon dioxide ($SiO_2$) material is used to increase the process margin with respect to the hot phosphoric acid etch and also protect against the REI opening for source/drain contact formation reaching through the insulating layer 16 to the bottom semiconductor substrate layer 18.

Reference is now made to FIGS. 2-14 which illustrate the process steps in the formation of a transistor on an ultra-thin body and buried oxide (UTBB) substrate with shallow trench isolation (STI).

Figure 2:
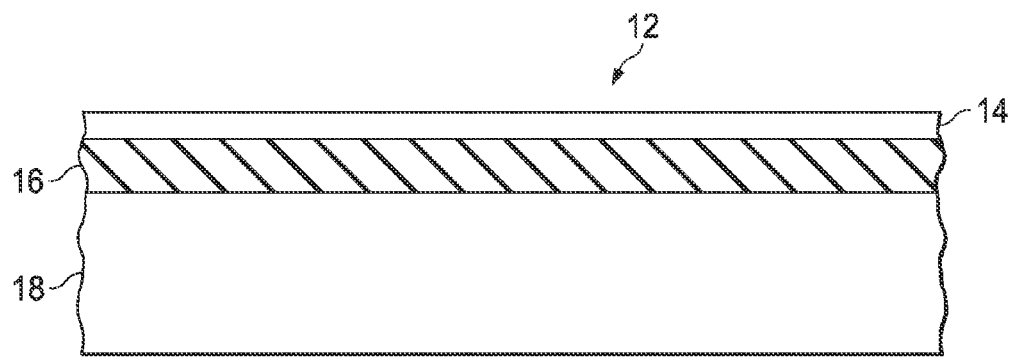
FIGS. 2-14 illustrate process steps in the formation of a transistor on an ultra-thin body and buried oxide (UTBB) substrate with shallow trench isolation (STI).

FIG. 2 shows a wafer of a conventional ultra-thin body and buried oxide (UTBB) substrate 12 comprising a top semiconductor (for example, silicon) layer 14 over an insulating (for example, silicon dioxide) layer (BOX) 16 over a bottom semiconductor (for example, silicon) substrate layer 18. The top semiconductor layer 14 may have a thickness of 5 nm to 10 nm. The insulating layer 16 may have a thickness of 10 nm to 30 nm. The bottom semiconductor substrate layer 18 may have a thickness of 100 microns to 800 microns. The top semiconductor layer 14 and bottom semiconductor substrate layer 18 may be doped as appropriate for the integrated circuit application. The thickness of the top and bottom semiconductor layers 14 and 18 may be tuned (for example, through the use of a thinning operation) as needed for the integrated circuit application. The top semiconductor layer 14 is preferably of a fully depleted (FD) configuration. Although a UTBB substrate is preferred, it will be understood that the substrate could alternatively comprise a silicon on insulator (SOI) substrate or extremely thin silicon on insulator (ETSOI) substrate.

Figure 3:
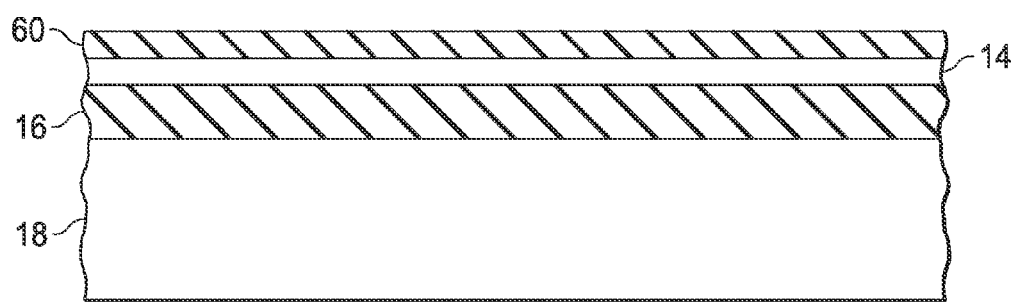

FIG. 3 shows the deposit of a pad oxide layer 60 over the top semiconductor layer 14 of the UTBB substrate. The pad oxide layer 60 is typically formed of silicon dioxide ($SiO_2$).

Figure 4:
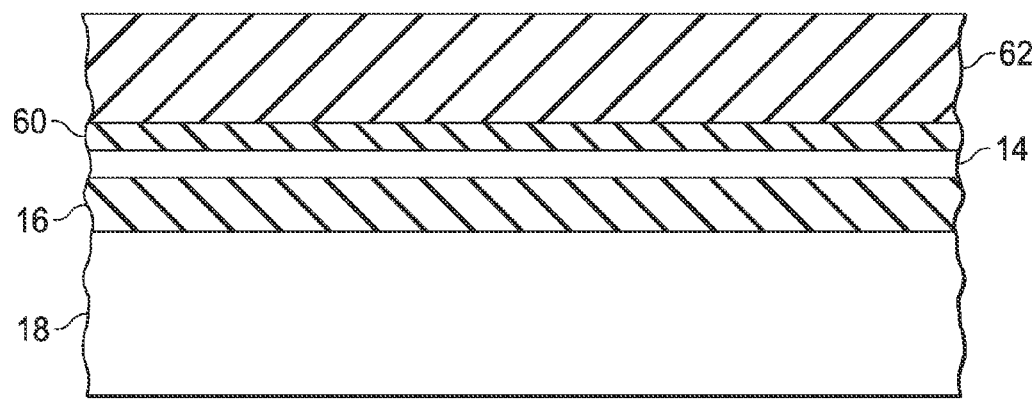

FIG. 4 shows the deposit of a silicon nitride (SiN) layer 62 over the pad oxide layer 60.

Figure 5:
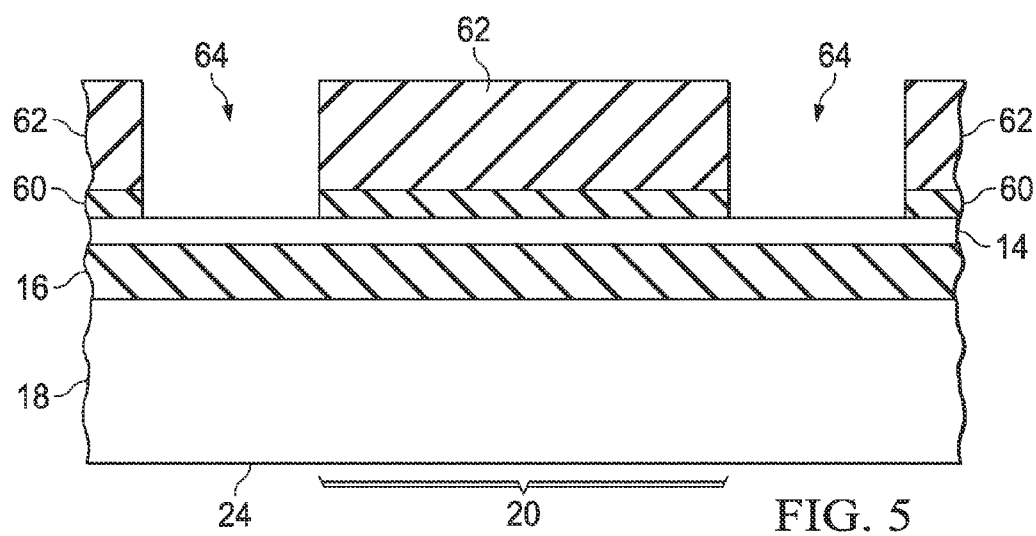

A lithographic process as known in the art is then used to form openings 64 in the silicon nitride layer 62 and pad oxide layer 60 (a SiN/$SiO_2$ hard mask) which extends down to reach at least the top surface of the top semiconductor layer 14 of the UTBB substrate. The result of the lithographic process is shown in FIG. 5. The openings 64 are associated with the formation of shallow trench isolation structures and thus define the location of the active region 20. In plan view, the openings 64 have on ring-like shape sized to surround the active region 20 and thus define the size and shape of the active region.

Figure 6:
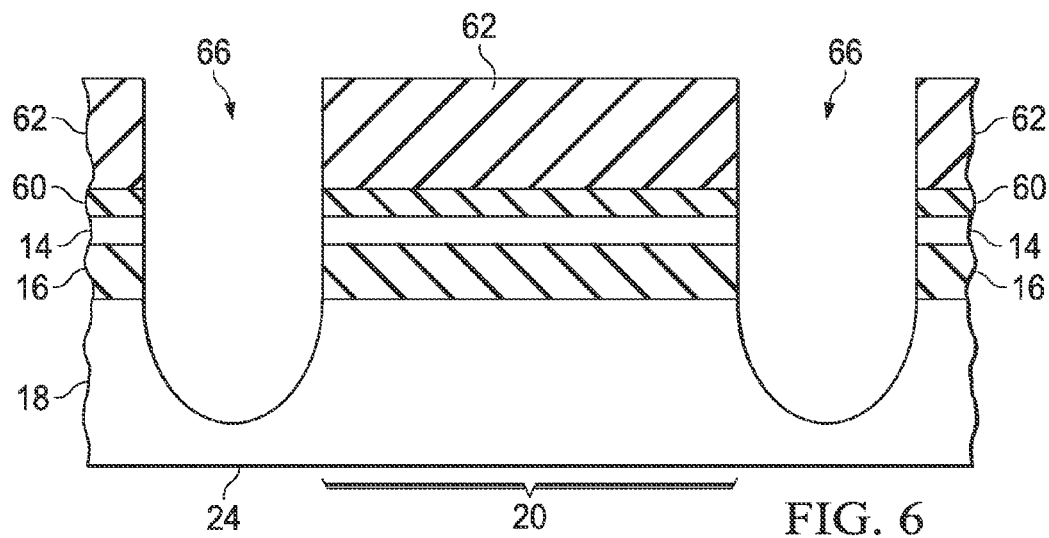

A high pressure directional etch process as known in the art is then performed through the openings 64 to form a trench 66 extending fully through the top semiconductor layer 14 and insulating layer 16 of the substrate 12. The trench 66 further penetrates into at least a portion of bottom semiconductor substrate layer 18. The etch may comprise an RIE process as known in the art. The result of the directional etch process is shown in FIG. 6. Although not specifically illustrated in FIG. 6, in an embodiment the trench 66 may extend fully through the bottom semiconductor substrate layer 18 to reach a bottom surface 24 of the substrate 12.

Figure 7:
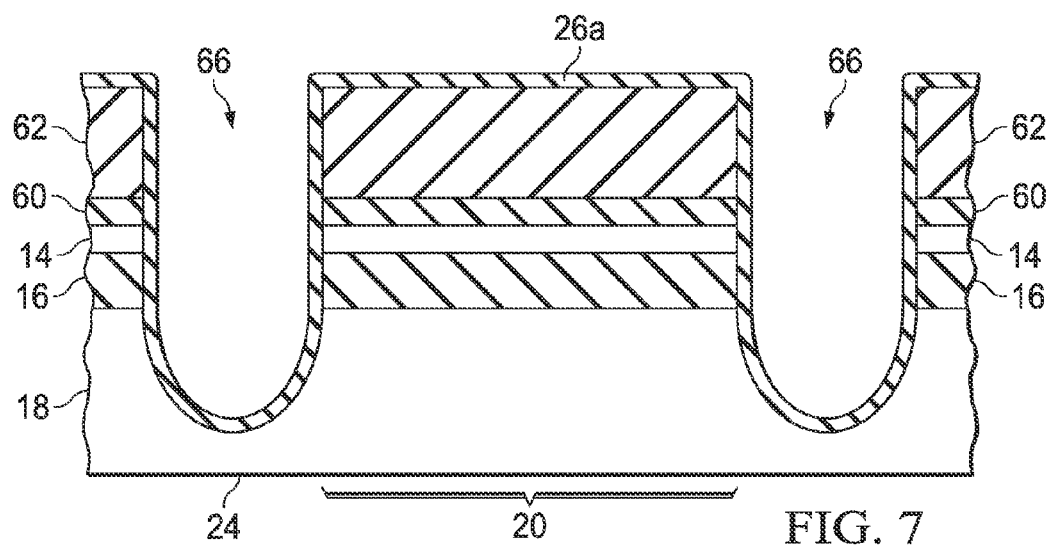

FIG. 7 shows the deposit of a conformal silicon dioxide ($SiO_2$) liner 26a over the wafer substrate 12. The liner 26a covers the inside of the trench 66.

Figure 8:
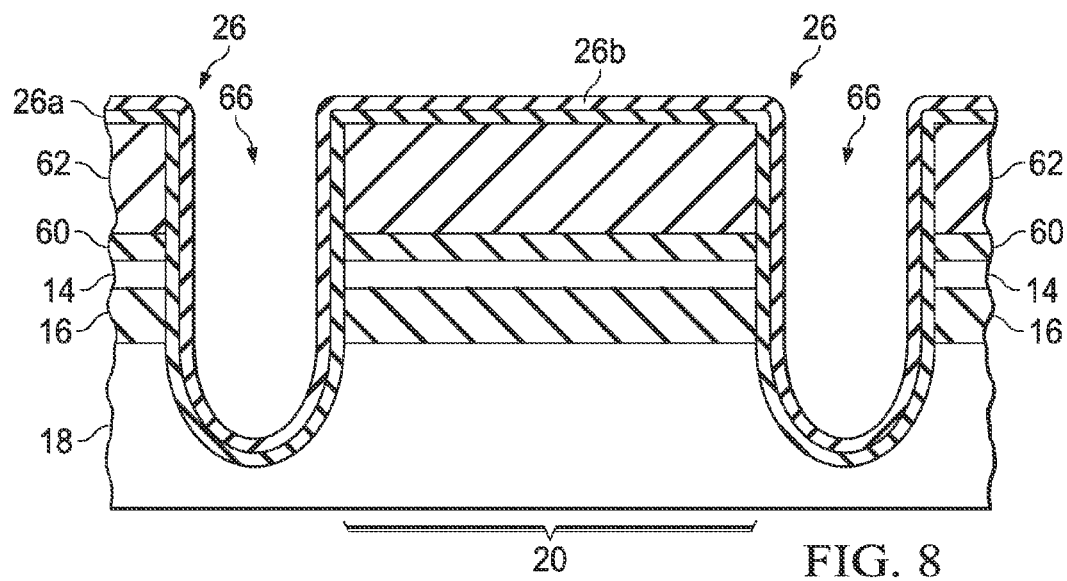

FIG. 8 shows the deposit of a conformal silicon nitride (SiN) liner 26b over the silicon dioxide ($SiO_2$) liner 26a. The liner 26b covers the inside of the trench 66.

The liners 26a and 26b define a dual liner 26 structure within the trench 66.

Figure 9:
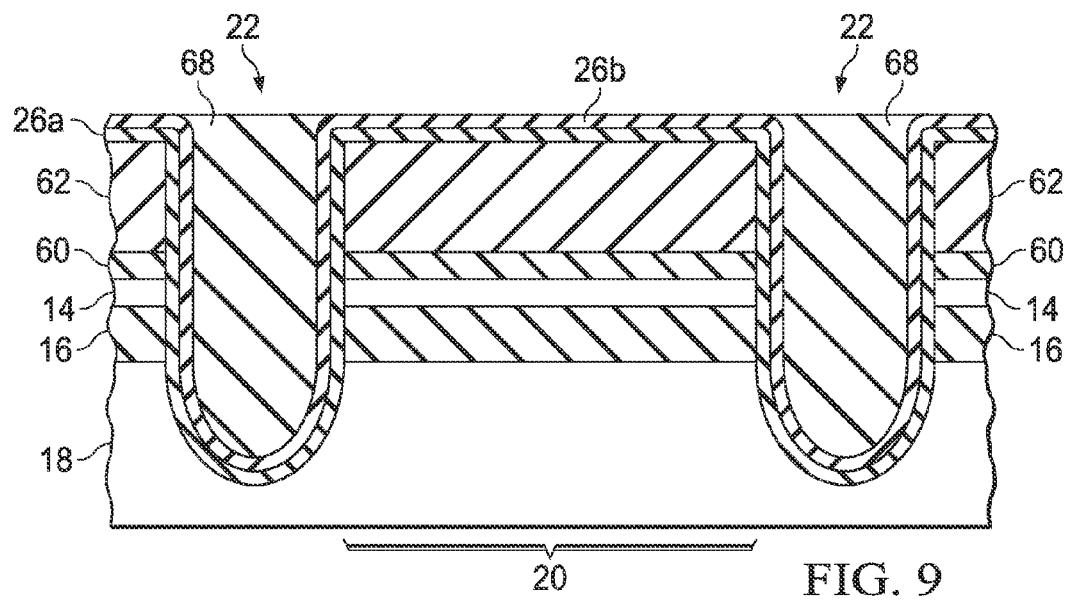

Using a high aspect ratio deposition process (HARP) known to those skilled in the art, the trench 66 is filled with an insulating material 68 such as silicon dioxide ($SiO_2$). The filling of the trench 66 with silicon dioxide ($SiO_2$) material 68 produces an overflow on top of the dual liner 26 structure. A thermal anneal process at a temperature of 1050-1100 degrees Centigrade is then performed. A planarization process (for example, chemical-mechanical polishing (CMP)) is used to remove the overflow of silicon dioxide ($SiO_2$) material 68 and flatten the top of the substrate wafer. The polish stops at the silicon nitride (SiN) liner 26b. The result of the fill/anneal/polish process is shown in FIG. 9. A shallow trench isolation (STI) structure 22, comprised of the dual liner 26 and silicon dioxide ($SiO_2$) material 68, is thus formed to surround the active region 20.

Figure 10:
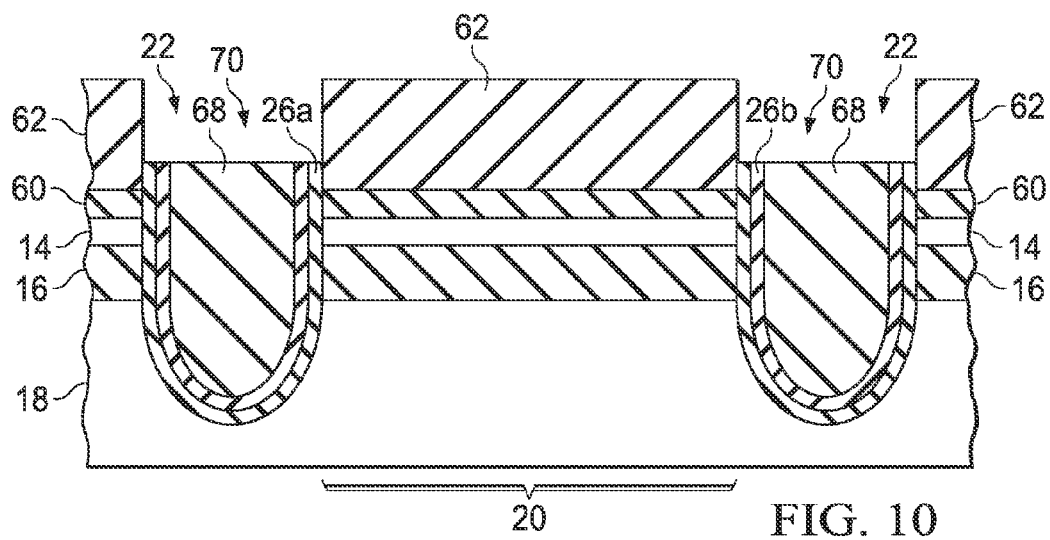

A deglazing process as known in the art is then performed to recess the dual liner 26 and silicon dioxide ($SiO_2$) material 68 as indicated at reference 70. The result of the deglazing process is shown in FIG. 10. The deglazing process may utilize hydrofluoric (HF) acid and a HF acid diluted by ethylene glycol (HFEG) solution to both clean the surface on SiN and etch the $SiO_2$ inside the STI structure. The hydrofluoric (HF) acid removes the silicon dioxide ($SiO_2$) material 68 while the HFEG solution removes the silicon dioxide ($SiO_2$) and silicon nitride (SiN) of the dual liner 26.

A hot phosphoric acid etch process as known in the art is then used to remove the silicon nitride layer 62 all the way down to the underlying pad oxide layer 60 made of silicon dioxide ($SiO_2$) material. It will be noted that this hot phosphoric acid etch process will also attack the silicon nitride (SiN) liner 26b of the dual liner 26. A portion 76 of the silicon nitride (SiN) liner 26b is accordingly removed. The result of the hot phosphoric acid etch process is shown in FIG. 11.

Figure 11:
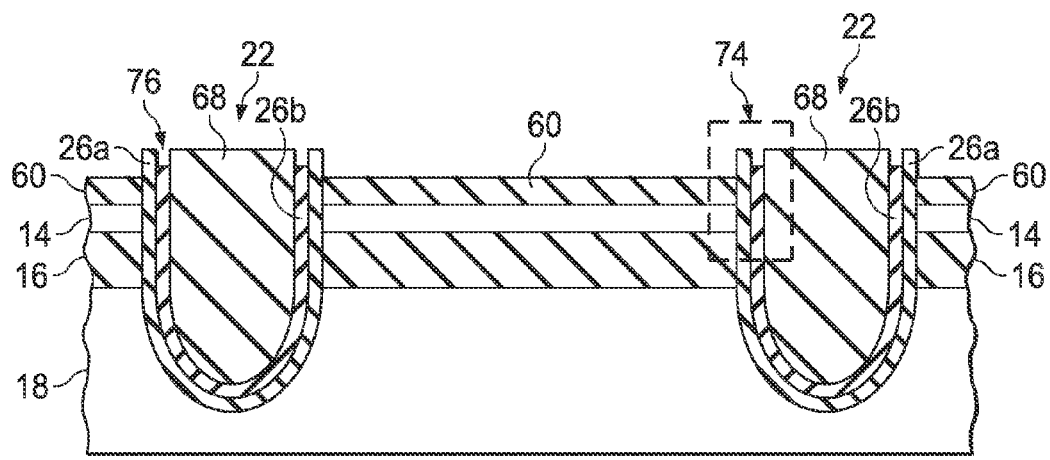
Figure 12:
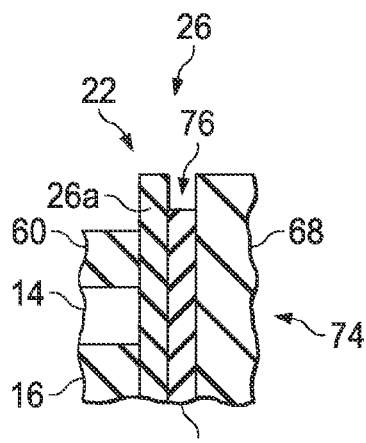

FIG. 12 illustrates a close-up view of region 74 in FIG. 11. With respect to the silicon nitride (SiN) liner 26b of the dual liner 26, the hot phosphoric acid etch process has attacked and removed a portion (divot) 76 of that silicon nitride (SiN) liner 26b at the top of the STI structure 22 between the silicon dioxide ($SiO_2$) liner 26a and the silicon dioxide ($SiO_2$) material 68 which fills the trench. The divot 76, however, is of little concern because only a limited amount of the silicon nitride (SiN) liner 26b is removed and the silicon dioxide ($SiO_2$) liner 26a precludes the divot from reaching through the substrate wafer to the underlying bottom semiconductor substrate layer 18.

A hydrofluoric (HF) acid etch process as known in the art is then used to remove the pad oxide layer 60 made of silicon dioxide ($SiO_2$) material all the way down to the underlying top semiconductor layer 14. It will be noted that this hydrofluoric (HF) acid etch process will also attack the silicon dioxide ($SiO_2$) liner 26a of the dual liner 26. A portion 86 of the silicon dioxide ($SiO_2$) liner 26a is accordingly removed. The result of the hydrofluoric (HF) acid etch process is shown in FIG. 13.

Figure 13:
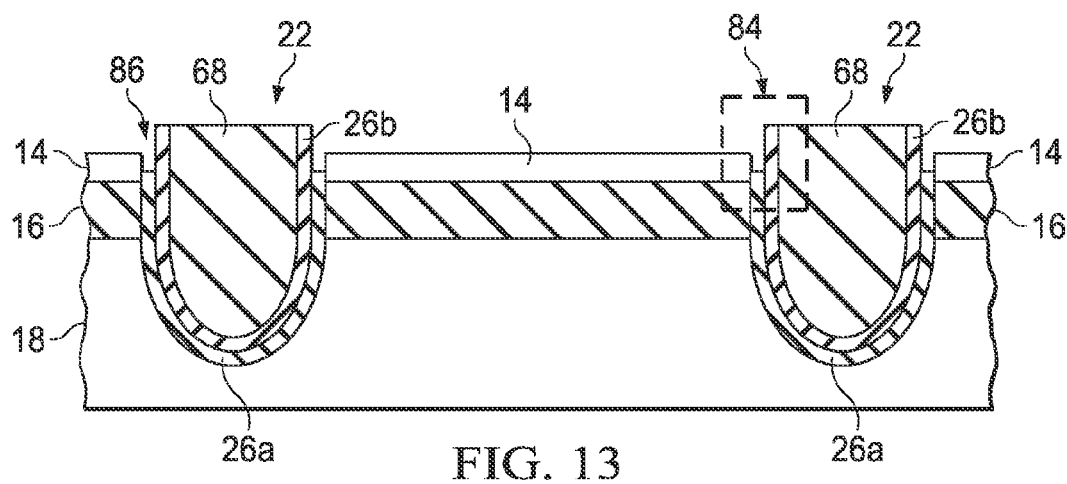
Figure 14:
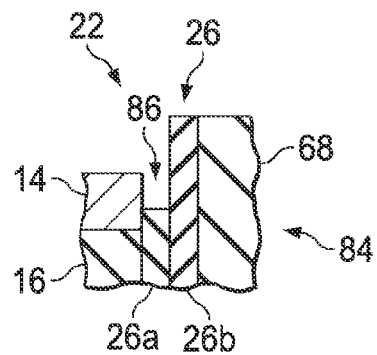

FIG. 14 illustrates a close-up view of region 84 in FIG. 13. With respect to the silicon dioxide ($SiO_2$) liner 26a of the dual liner 26, the hydrofluoric (HF) acid etch process has attacked and removed a portion (divot) 86 of that silicon dioxide ($SiO_2$) liner 26a at the top of the STI structure 22 between the silicon nitride (SiN) liner 26b and the top semiconductor layer 14. The divot 86, however, is of little concern because only a limited amount of the silicon dioxide ($SiO_2$) liner 26a is removed. The sandwiched construction of the dual liner 26 with the silicon nitride (SiN) liner 26b minimizes the depth of the divot so that it does not reach through the substrate wafer to the underlying bottom semiconductor substrate layer 18.

Conventional transistor fabrication processing as known in the art is then performed to obtain the gate stack, raised source/drain structures, dopant implantation, silicidation, etc., so as to complete construction of the transistor (see, FIG. 1). During such fabrication processing, the silicon nitride (SiN) liner 26b serves as a protection liner against divot formation at the edge of the STI structure 22 when etching (such as RIE targeted to etch silicon nitride while having high selectivity to silicon dioxide) is performed to support the making of metal contact to the source/drain regions. This prevents the formation of a short between the source/drain regions and the underlying bottom semiconductor substrate layer 18 when silicidation and/or metal contact deposition is formed.

The process described above presents a number of advantages including: a) it supports of a large hydrofluoric acid budget amenable to the formation of two or more gate stacks; b) it addresses concerns over SiN liner and $SiO_2$ liner recess; c) it prevents defect issues with respect to short through; d) it is compatible with future downscaling of the buried oxide (BOX) layer in SOI, ETSOI and ETTB type substrates used in CMOS process; and e) it is easy to implement using standard processing techniques and is compatible with standard integration schemes.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
   on a substrate formed of a first semiconductor layer over an insulating layer over a second semiconductor layer, depositing a first pad layer formed of a first pad material;
   depositing a second pad layer formed of a second pad material;
   patterning the first and second pad layers to define a mask;
   using said mask to open a trench surrounding an active region, said trench extending through both the first semiconductor layer and the insulating layer and further extending at least partially into the second semiconductor layer;
   depositing a first conformal liner made of a first liner material in said trench;
   depositing a second conformal liner made of a second liner material on said first conformal liner in said trench;
   filling said trench with an insulating material;
   removing the second pad layer along with a portion of the second conformal liner near a top of the filled trench to form a first divot between the first conformal liner and the insulating material filling said trench; and
   removing the first pad layer, a portion of the insulating material filling said trench and a portion of the first conformal liner near the top of the filled trench to form a second divot between the second conformal liner and the first semiconductor layer.

2. The method of claim 1, wherein the first pad material, insulating material and first liner material are all a same material.

3. The method of claim 2, where said same material is silicon dioxide.

4. The method of claim 1, wherein the second pad material and second liner material are all a same material.

5. The method of claim 4, wherein said same material is silicon nitride.

6. The method of claim 1, wherein said substrate is an ultra-thin body and buried oxide (UTBB) substrate and said first and second conformal liners protect against etch through of the substrate at an edge of said trench between the first and second semiconductor layers.

7. A method, comprising:
   on a substrate formed of a first semiconductor layer over an insulating layer over a second semiconductor layer, depositing a silicon oxide pad layer;
   depositing a silicon nitride pad layer on said silicon oxide pad layer;
   patterning the silicon nitride and silicon oxide pad layers to define a mask;
   applying a directional etch through said mask to open a trench surrounding an active region, said trench extending through both the first semiconductor layer and the insulating layer and further extending at least partially into the second semiconductor layer;
   depositing a conformal silicon dioxide liner in said trench;
   depositing a conformal silicon nitride liner on said conformal silicon dioxide liner in said trench;
   filling said trench with a silicon dioxide material;
   applying a hydrofluoric acid etch to remove the silicon nitride pad layer along with a top portion of the conformal silicon nitride liner to form a first divot between the conformal silicon dioxide liner and the silicon dioxide material filling said trench; and
   applying a hot phosphoric acid etch to remove the silicon oxide pad layer, a portion of the silicon oxide material filling said trench and a top portion of the conformal silicon nitride liner to form a second divot between the conformal silicon nitride liner and the first semiconductor layer.

8. The method of claim 7, further comprising:
   building a gate stack over a channel region of the first semiconductor layer; and
   building raised source/drain structures from the first semiconductor layer on opposite sides of the gate stack.

9. The method of claim 7, wherein said first and second conformal liners protect against hydrofluoric acid etch and hot phosphoric acid etch through of the substrate at an edge of said trench between the first and second semiconductor layers.

10. The method of claim 7, wherein said substrate is an ultra-thin body and buried oxide (UTBB) substrate and said first and second conformal liners protect against etch through of the substrate at an edge of said trench between the first and second semiconductor layers.

* * * * *